United States Patent [19]
Ohtsuka et al.

[11] Patent Number: 5,859,753
[45] Date of Patent: Jan. 12, 1999

[54] SPIN VALVE MAGNETORESISTIVE HEAD WITH SPUN VALVES CONNECTED IN SERIES

[75] Inventors: Yoshinori Ohtsuka; Yoshifumi Mizoshita; Takao Koshikawa, all of Kanagawa, Japan

[73] Assignee: Fujitsu Limited, Kawasaki, Japan

[21] Appl. No.: 766,940

[22] Filed: Dec. 16, 1996

[30] Foreign Application Priority Data

Apr. 4, 1996 [JP] Japan .................................. 8-082238

[51] Int. Cl.$^6$ ........................................................ G11B 5/39
[52] U.S. Cl. ............................................................. 360/113
[58] Field of Search ............................................. 360/113

[56] References Cited

U.S. PATENT DOCUMENTS

| | | | |
|---|---|---|---|
| 5,287,238 | 2/1994 | Baumgart et al. | 360/113 |
| 5,442,508 | 8/1995 | Smith | 360/113 |
| 5,576,915 | 11/1996 | Akiiyama et al. | 360/113 |
| 5,627,703 | 5/1997 | Smith | 360/113 |

FOREIGN PATENT DOCUMENTS

| | | |
|---|---|---|
| 63-23217 | 1/1988 | Japan . |
| 721530 | 1/1995 | Japan . |

OTHER PUBLICATIONS

Thomas C. Anthony et al.—Dual Stripe Magnetoresistive Heads for High Density Recording—IEEE Transactions on Magnetics, vol. 30, No. 2 Mar. 1994.

*Primary Examiner*—John H. Wolff
*Attorney, Agent, or Firm*—Greer, Burns & Crain, Ltd.

[57] ABSTRACT

A spin valve magnetoresistive head comprises a first spin valve device having a first magnetization free layer and a first magnetization pinning layer via a first non-magnetic intermediate layer, a second spin valve device having a second magnetization free layer and a second magnetization pinning layer via a second non-magnetic intermediate layer, whereby the first and second magnetization pinning layers are magnetized in anti-parallel to each other and the first and second magnetization free layers are magnetized rotatably based on an external magnetic field.

12 Claims, 14 Drawing Sheets

SPIN VALVE MAGNETORESISTIVE HEAD WITH SPUN VALVES CONNECTED IN SERIES

BACKGROUND OF THE INVENTION

1. Field of the Invention

The present invention relates to a spin valve magnetoresistive head, a method of manufacturing the same, and a magnetic memory apparatus and, more particularly, to a spin valve magnetoresistive head for use in a magnetic disk drive, a magnetic tape unit, etc., a method of manufacturing the same, and a magnetic memory apparatus.

2. Description of the Prior Art

In recent years, with miniaturization and increase in storage capacity of the magnetic disk drive, higher performance of the magnetic head is required. As the design of magnetic heads meet such requirements, great attention has been given to a magnetoresistive type magnetic head (referred to as a "MR head" hereinafter) which can operate without depending on the moving speed of storage medium, can be applied to a small size disk, and can output higher outputs.

AMR (anisotropic MR) head using magnetically biased conductor layers, spin valve MR head, giant MR head, and others may be considered as the MR head.

The MR head that uses the magnetically biased conductor layers, such has a structure such that part of the MR layers and lead terminals are exposed to oppose to a magnetic recording medium. In the MR head having such structure, short-circuit or discharge between the magnetic head and the magnetic recording medium is possible when a flying height of the magnetic head from the magnetic recording medium is reduced. As a result, it is feared that the magnetic head would be damaged.

The magnetic head having a structure able to overcome such a problem has been set forth in Patent Application Publication (KOKAI) 63-23217, for instance, wherein the MR layers are arranged to flow sense currents in the same direction as the signal magnetic field and only grounding lead terminals are exposed to the magnetic recording medium side. This MR head is particularly effective in a contact region between a surface of the magnetic recording medium and the MR head. The MR magnetic head having such structure is called a vertical MR head.

In addition, it is very possible that thermal asperity occurs in the MR head when the MR head collides with projections on the surface of the magnetic recording medium. The thermal asperity is expressed as a raise of the temperature of the MR device because of collision of the MR head with projections to thus increase electric resistance value.

As one countermeasure to suppress generation of the thermal asperity, a dual element type MR head has been proposed. This MR head has been set forth in, for example, Thomas C. Anthony et al., IEEE Transactions on Magnetics, Vol.30, No.2, March 1994, pp.303–308.

In these MR head, as shown in FIG. 1 for illustrative purposes only, the first MR layer 103 and the second MR layer 104 connected to leads 101, 102 respectively are arranged in parallel and sense currents passing through these first and second MR layers 103, 104 are detected in a differential manner by directing respective directions of the sense currents $I_1, I_2$ to mutually opposite directions. Simbol $H_{sig}$ is a signal magnetic field.

Though resistance of the first and second MR layers 103, 104 are increased respectively, as shown in FIG. 2, once the thermal asperity has occurred, in-phase components of the resistance are canceled mutually since they are detected in a differential manner. Where the sense current $I_1, I_2$ is a constant current and therefore the change in resistance appears as the change in voltage.

Furthermore, the MR head having both the above vertical MR head and the dual element type MR head has been set forth in Patent Application Publication (KOKAI) 7-21530.

However, since the MR head set forth in the Patent Application Publication (KOKAI) 7-21530 is the MR head having biased conductive layers, no mention concerning a spin valve type MR head has been given in the Patent Application Publication (KOKAI) 7-21530 since a basic structure of the former differs from that of the latter. Accordingly, it is impossible to apply the structure disclosed in this Patent Application Publication (KOKAI) 7-21530 to the spin valve type MR head as it is.

SUMMARY OF THE INVENTION

An object of the present invention is to provide a spin valve magnetoresistive head capable of suppressing generation of thermal asperity and preventing discharge and short-circuit between a magnetic medium and the head, a method of manufacturing the same, and a magnetic memory apparatus using the spin valve magnetoresistive head.

According to the present invention, the spin valve MR is so formed that two spin valve devices each comprising at least a magnetization pinning layer, a non-magnetic intermediate layer, and a magnetization free layer are stacked and magnetization directions of the magnetization pinning layers are set in anti-parallel to each other. For this reason, when resistance of one spin valve device is increased by a signal magnetic field, resistance of the other spin valve device is decreased by the signal magnetic field and therefore the signal can be enhanced if changes in these resistances, i.e., changes in voltages are detected in a differential fashion. As a result, not only a S/N ratio of the spin valve MR head can be improved but also increase in resistance of both spin valve devices due to the thermal asperity can be canceled by a differential detection scheme, so that the detected signal of resistance change is hardly susceptible to noises caused by the thermal asperity.

On the contrary, since one electrode of the electrodes connected to these spin valve devices respectively are arranged on the magnetic recording medium side while other electrodes of the electrodes are arranged far from the magnetic recording medium, no discharge will be caused between the spin valve device and the magnetic recording medium if the potential of one electrode is set at the same potential as the magnetic recording medium.

Moreover, if a conductive film or a conductive layer is formed on an opposing surface of such two spin valve devices to the magnetic recording medium so as to be used as an electrode of the spin valve device, the spin valve devices are not exposed and are protected.

In the case that, in order to fix magnetization direction of respective magnetization pinning layers of two spin valve devices in anti-parallel to each other, two antiferromagnetic layers are formed to be stacked on respective magnetization pinning layers individually, these magnetization pinning layers may be magnetized in anti-parallel to each other if respective antiferromagnetic layers are formed of different materials having different blocking temperature. In summary, if two antiferromagnetic layers are magnetized individually with the use of different heating temperatures, respective magnetization directions of two antiferromagnetic layers may be controlled independently in response to respective different blocking temperatures.

In addition, in order to fix magnetization of respective magnetization pinning layers of two spin valve devices, a hard magnetic layer may be used. In this event, magnetization directions of two hard magnetic layers may be controlled by setting them in the anti-parallel direction by making use of the difference in coercive force of magnetization of two hard magnetic layers.

Other and further objects and features of the present invention will become obvious upon an understanding of the illustrative embodiments about to be described in connection with the accompanying drawings or will be indicated in the appended claims, and various advantages not referred to herein will occur to one skilled in the art upon employing the invention in practice.

DESCRIPTION OF THE PREFERRED EMBODIMENTS

There will be described various preferred embodiments of the present invention with reference to the accompanying drawings hereinbelow. It should be noted that the same or similar reference symbols are applied to the same or similar parts and elements throughout the drawings, and therefore the description of the same or similar parts and elements will be omitted or simplified. In the representation of semiconductor devices, it will be appreciated that the various drawings are not drawn to scale from one figure to another nor inside a given figure.

First Embodiment

Figure 3:
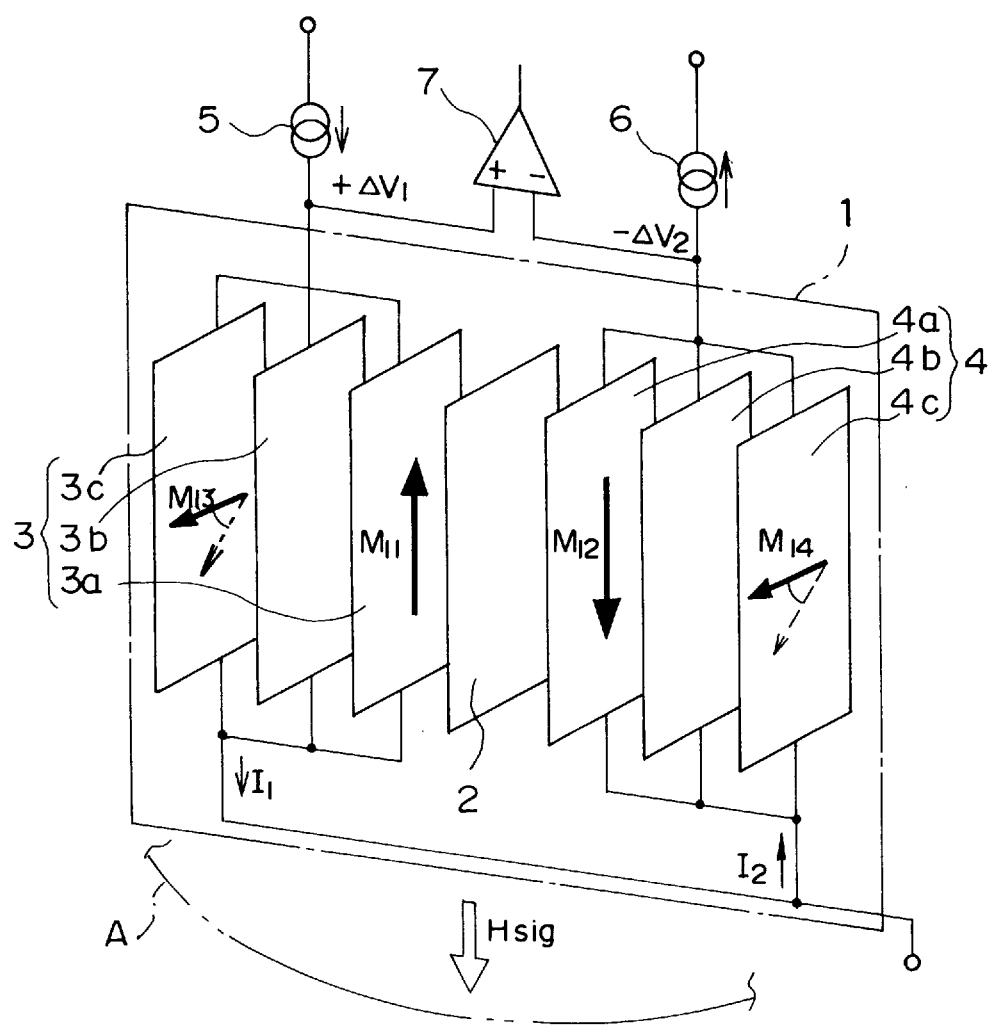
FIG. 3 is an exploded perspective view showing a layer structure and circuit-connection of a spin valve device according to a first embodiment of the present invention for use in a reproduction only magnetic head in a magnetic memory apparatus.

FIG. 3 is an exploded view showing a layer structure and electrical circuit-connection of a spin valve device according to a first embodiment of the present invention.

As shown in FIG. 3, an MR head 1 comprises a first spin valve device 3 and a second spin valve device 4 which are formed via a non-magnetic intermediate insulating layer 2.

Opposing sides of the first spin valve device 3 and the second spin valve device 4 to the magnetic recording medium A are set at identical or substantially identical potential to the magnetic recording medium A, and opposite sides of the first spin valve device 3 and the second spin valve device 4 are connected to constant-current sources 5, 6 individually. In the first spin valve device 3 and the second spin valve device 4, currents are thus blowing in the direction substantially perpendicular to the surface opposing to the magnetic recording medium.

The first spin valve device 3 is formed by stacking a first magnetization pinning layer 3a, a first non-magnetic intermediate layer 3b made of conductive material, and a first magnetization free layer 3c made of soft magnetic material in sequence.

The second spin valve device 4 is formed by stacking a second magnetization pinning layer 4a, a second non-magnetic intermediate layer 4b made of conductive material, and a second magnetization free layer 4c made of soft magnetic material in sequence.

Magnetization M11 of the first magnetization pinning layer 3a and magnetization M12 of the second magnetization pinning layer 4a are fixed mutually in the anti-parallel direction, and these fixed magnetization M11, M12 are perpendicular to the opposing surface to the magnetic recording medium. If the first magnetization pinning layer 3a and the second magnetization pinning layer 4a are formed of soft magnetic material, these magnetization M11, M12 are fixed by means of either magnetization of hard magnetic layers (not shown) or exchange couplings between antiferromagnetic layers and these magnetization pinning layers. Their details will be explained in embodiments described later.

The first magnetization free layer 3c is magnetized by a magnetic field which is generated by a current $I_2$ passing through the second spin valve device 4 such that magnetization M13 of the first magnetization free layer 3c makes an angle of 90 degree with magnetization M11 of the first magnetization pinning layer 3a. On the contrary, the second magnetization free layer 4c is so magnetized by a magnetic field which is generated by a current $I_1$ flowing through the first spin valve device 3 that magnetization M14 of the second magnetization free layer 4c makes an angle of 90 degree with magnetization M12 of the second magnetization pinning layer 4a. In this case, magnetization M13 of the first magnetization free layer 3c and magnetization M14 of the second magnetization free layer 4c may be selected mutually in either the same direction or opposite direction.

An end of the first spin valve device 3 opposite to the end of the first spin valve 3 facing the magnetic recording medium A is connected to a (+) side input terminal of a differential amplifier circuit 7 while an end of the second spin valve device 4 opposite to the end of the second spin valve 4 facing the magnetic recording medium A is connected to a (−) side input terminal of the differential amplifier circuit 7.

In such spin valve MR head 1, when an external magnetic field $H_{sig}$ shown in FIG. 3 is applied to the first spin valve device 3 and the second spin valve device 4, magnetization M13 of the first magnetization free layer 3c and magnetization M14 of the second magnetization free layer 4c are rotated in the same direction and are inclined.

In this event, since opposite components of magnetization M13 of the first magnetization free layer 3c relative to magnetization M11 of the first magnetization pinning layer 3a are increased, electric resistance of the first spin valve device 3 is enhanced so that the voltage applied across the first spin valve device 3 is increased by $+\Delta V_1$.

Conversely, since components of magnetization M14 of the second magnetization free layer 4c in the same direction as magnetization M12 of the second magnetization pinning layer 4a are increased, electric resistance of the second spin valve device 4 is reduced, which result in increase in the voltage applied across the second spin valve device 4 by $-\Delta V_2$.

By subtracting voltage applied across the second spin valve device 4 from voltage applied across the first spin valve device 3, voltage being input into the differential amplifier circuit 7 is varied by $\Delta V_1-(-\Delta V_2)$. Therefore, resistance change caused by voltage change $\Delta V_1+\Delta V_2$ obtained by two spin valve devices 3, 4 becomes high rather than resistance change in the MR head including only one spin valve device. The resistance change may be calculated by an electric resistance calculating circuit (not shown).

In the meanwhile, if thermal asperity takes place, voltage applied across the first spin valve device 3 is increased to the same extent as voltage applied across the second spin valve device 4 since electric resistances are increased in both the first spin valve device 3 and the second spin valve device 4 in a similar fashion. Therefore, increase in respective resistances can be canceled in the differential amplifier circuit 7.

Figure 1:
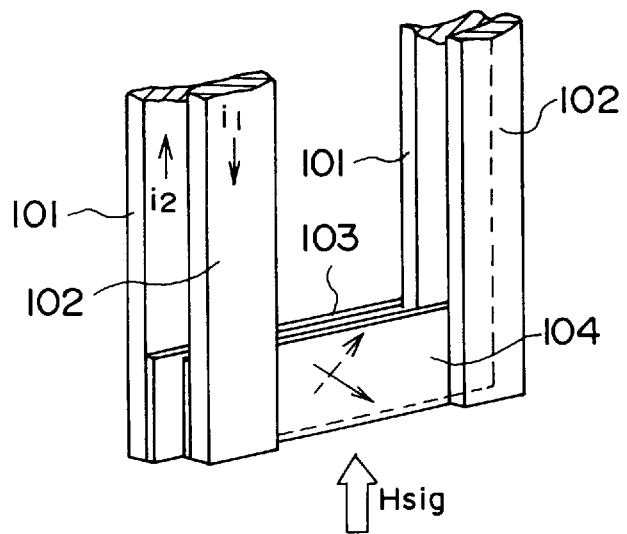
FIG. 1 is a perspective view showing an example of a plurality of magnetoresistive devices arranged in parallel, to which a conventional bias magnetic field is applied.
Figure 2:
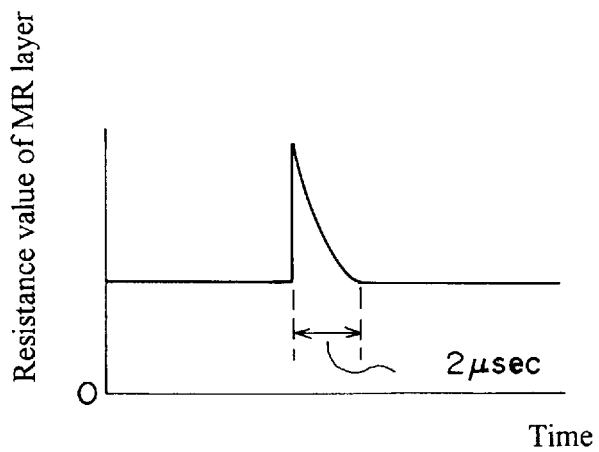
FIG. 2 is a waveform chart showing a resistance change in respective magnetoresistive devices arranged in parallel in FIG. 1.

A waveform of the resistance change is substantially similar to that shown in FIG. 2.

Since electric potential of the surfaces of the first spin valve device 3 and the second spin valve device 4 opposing to the magnetic recording medium A has been adjusted, discharge and electric short-circuit between the surfaces and the magnetic recording medium A in no way occur. By way of example, the magnetic recording medium A is connected to ground.

Figure 4:
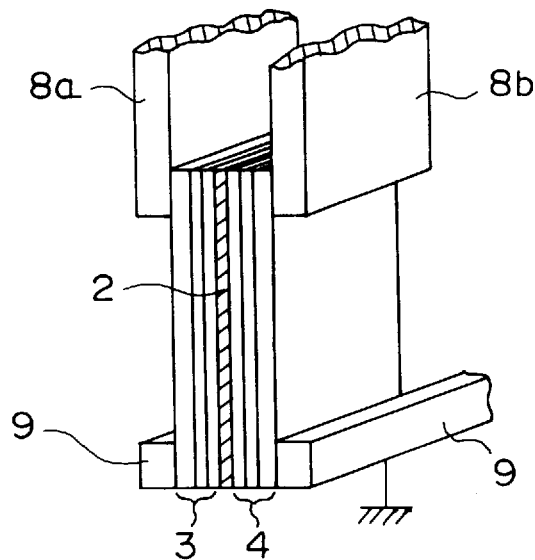
FIG. 4 is a perspective view showing a first example of connection between electrodes and the spin valve device according to the first embodiment of the present invention for use in the reproduction only magnetic head.
Figure 5:
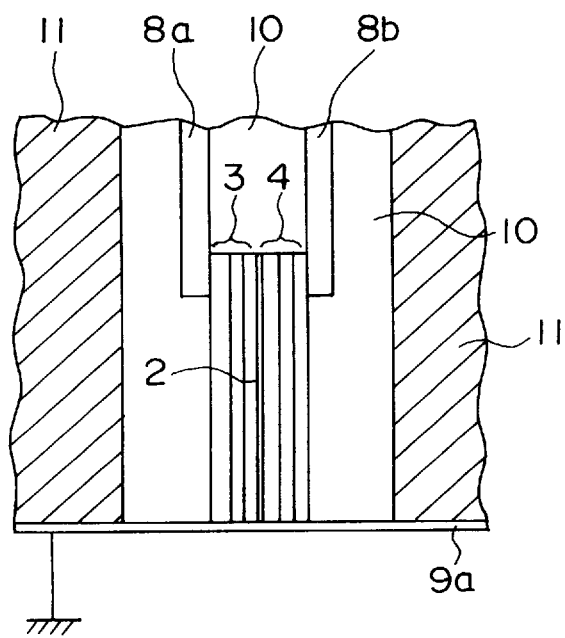
FIG. 5 is a sectional view showing a second example of connection between electrodes and the spin valve device according to the first embodiment of the present invention for use in the reproduction only magnetic head.
Figure 6:
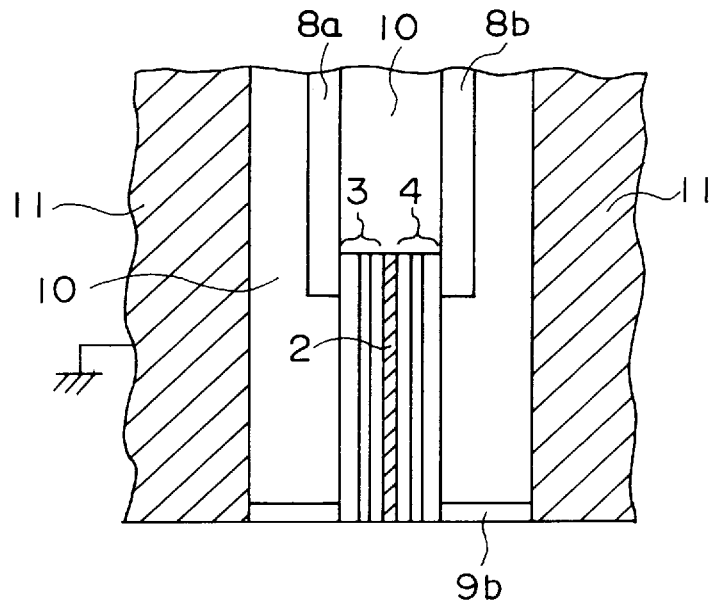
FIG. 6 is a sectional view showing a third example of connection between electrodes and the spin valve device according to the first embodiment of the present invention for use in the reproduction only magnetic head.

As shown in FIGS. 4 to 6, the first spin valve device 3 and the second spin valve device 4, formed as above, are stacked via the intermediate insulating layer 2. A plan profile of the devices 3, 4 is formed as a rectangular shape. One end of the respective layers constituting the first spin valve device 3 and the second spin valve device 4 are fitted to a head slider so as to oppose to the magnetic recording medium A. Further, following electrodes are connected to these devices.

As shown in FIGS. 4 to 6, a (+) electrode 8a is connected to an upper end of the first spin valve device 3 arranged over the magnetic recording medium A, and a (−) electrode 8b is connected to an upper end of the second spin valve device 4 arranged over the magnetic recording medium A.

As shown in FIG. 4, medium opposing electrodes 9 are secured to respective lowermost side surfaces of the first spin valve device 3 and the second spin valve device 4. The medium opposing electrodes 9 are set at identical electric potential or substantially identical electric potential to electric potential of the magnetic recording medium A.

As shown in FIG. 5, the first spin valve device 3 and the second spin valve device 4 are surrounded by an insulating layer 10 such as $Al_2O_3$. Magnetic shielding layers 11 made of NiFe are formed on both outer sides of the insulating layer 10. The medium opposing electrode 9a made of non-magnetic conductive material such as tungsten, tantalum, etc. is formed continuously on respective lowermost surfaces of the first spin valve device 3, the second spin valve device 4, the insulating layer 10, and the magnetic shielding layers 11 to have a thickness of less than 100 nm. With the above structure, a reproduction only magnetic head has been completed.

As shown in FIG. 6, the first spin valve device 3 and the second spin valve device 4 are surrounded by the insulating layer 10 such as $Al_2O_3$. The magnetic shielding layers 11 made of NiFe are formed on both outer sides of the insulating layer 10. A conductive layer 9b is formed on the lower surfaces of the first spin valve device 3 and the second spin valve device 4, and respective medium facing surfaces of the insulating layer 10. According to the above structure, the reproduction only magnetic head has been accomplished.

The conductive layer 9b is formed by ion-implanting non-magnetic metal element such as CrZr into surface layers of the first and second spin valve devices 3, 4 and the insulating layer 10. Accelerating energy upon ion-implantation can be so adjusted that a peak in concentration distribution of the non-magnetic metal element resides within a depth of 100 nm from the surfaces of the first spin valve device 3 and the second spin valve device 4.

Since the medium opposing electrode 9a and the conductive layer 9b are connected to the magnetic shielding layers 11, the medium facing surfaces of the first spin valve device 3 and the second spin valve device 4 have the same or substantially same electric potential as the shielding layer 11. Since the shielding layer 11 is set at the same or substantially same electric potential as the magnetic recording medium A, there is never caused discharge between the medium facing surfaces of the first spin valve device 3 and the second spin valve device 4 and the magnetic recording medium A.

Second Embodiment

Figure 7:
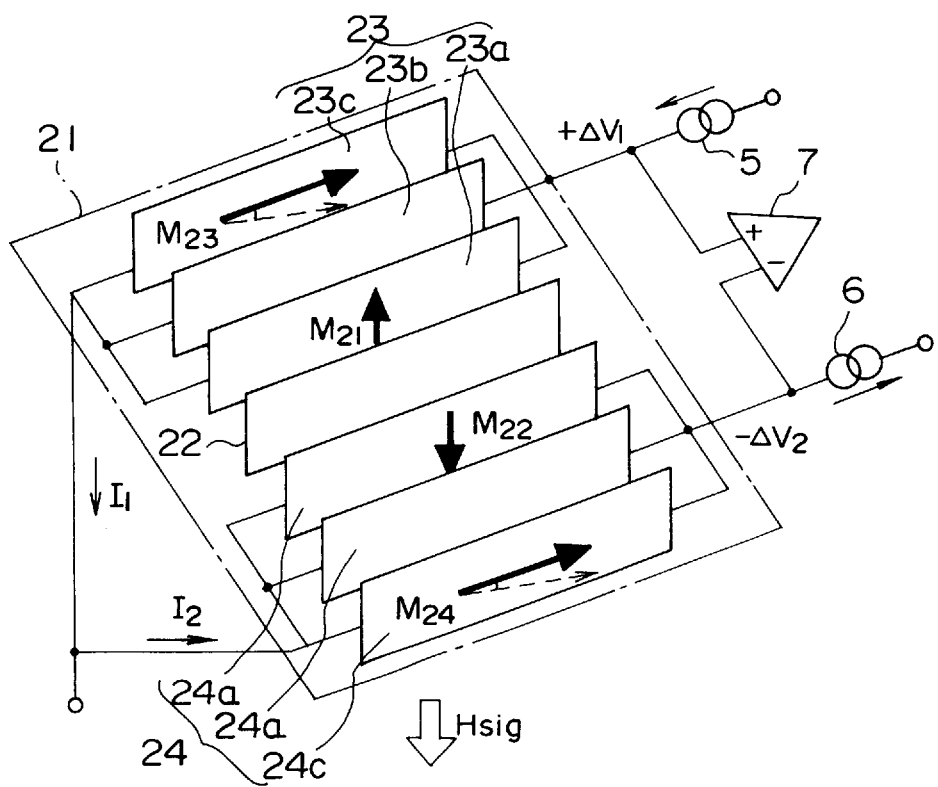
FIG. 7 is an exploded perspective view showing a layer structure and circuit-connection of a spin valve device according to a second embodiment of the present invention for use in the reproduction only magnetic head in the magnetic memory apparatus.
Figure 8:
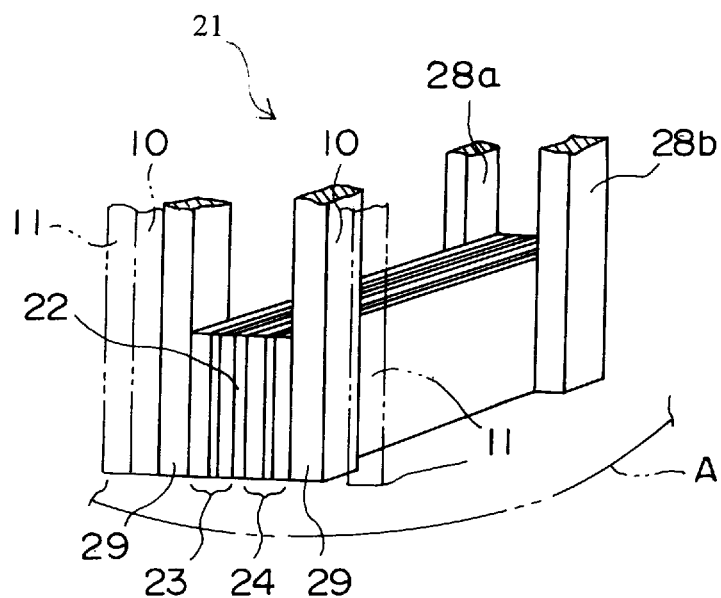
FIG. 8 is a perspective view showing a first example of connection between electrodes and the spin valve device according to the second embodiment of the present invention for use in the reproduction only magnetic head.

FIG. 7 is an exploded view showing a layer structure and electrical circuit-connection of a spin valve MR head according to a second embodiment of the present invention. FIG. 8 is a perspective view showing a first example of connection between electrodes and the spin valve MR head in FIG. 7.

Figure 9:
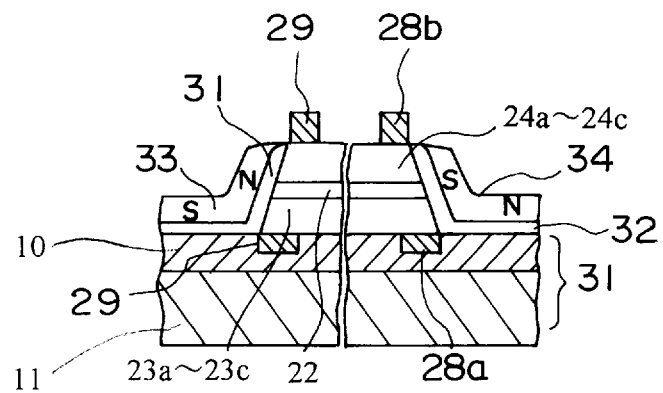
FIG. 9 is a side view showing an example of a layer structure with a view to controlling magnetization direction of magnetization free layers in the spin valve device according to the first or second embodiment of the present invention for use in the reproduction only magnetic head.

As shown in FIG. 9, an MR head 21 comprises a first spin valve device 23 and a second spin valve device 24 which are formed via a non-magnetic intermediate insulating layer 22. As shown in FIG. 8, a medium opposing electrode 29 and a first electrode 28a are connected respectively to one side-end portion and the other side-end portion of a surface of the first spin valve device 23 on the opposite side to an intermediate insulating layer 22. Similarly, another medium opposing electrode 29 and a second electrode 28b are connected respectively to one side-end portion and the other side-end portion of a surface of the second spin valve device 24 on the opposite side to the intermediate insulating layer 22. The first electrode 28a and the second electrode 28b are connected to the constant-current sources 5, 6 respectively.

The first electrode 28a is connected to a (+) side input terminal of the differential amplifier circuit 7 while the second electrode 28b is connected to a (−) side input terminal of the differential amplifier circuit 7.

The first spin valve device 23 is formed by depositing a first magnetization pinning layer 23a, a first non-magnetic intermediate layer 23b made of conductive material, and a first magnetization free layer 23c made of soft magnetic material in sequence.

The second spin valve device 24 is formed by depositing a second magnetization pinning layer 24a, a second non-magnetic intermediate layer 24b made of conductive material, and a second magnetization free layer 24c made of soft magnetic material in sequence.

Magnetization M21 of the first magnetization pinning layer 23a and magnetization M22 of the second magnetization pinning layer 24a are fixed in anti-parallel to each other, and these fixed magnetization M21, M22 are perpendicular to the opposing surface to the magnetic recording medium A. In case the first magnetization pinning layer 23a and the second magnetization pinning layer 24a are formed of soft magnetic material, these magnetization M21, M22 are fixed by virtue of either magnetization of hard magnetic layers (not shown) or exchange couplings between antiferromagnetic layers and these magnetization pinning layers. Their detailed explanation will be given in embodiments described later.

Under the condition the signal magnetic field $H_{sig}$ is not applied as shown in FIG. 7, the first magnetization free layer 23c is magnetized in the direction to make an angle of substantially 90 degree with magnetization M21 of the first magnetization pinning layer 23a. Similarly, the second magnetization free layer 24c is magnetized in the direction to make an angle of 90 degree with magnetization M22 of the second magnetization pinning layer 24a.

In order to control directions of magnetization M23 of the first magnetization free layer 23c and magnetization M24 of the second magnetization free layer 24c, a structure shown in FIGS. 7 and 9 will be adopted.

More particularly, such a structure can be adopted that magnetization controlling layers 34 and 35 made of hard magnetic material are formed respectively on end portions of the first magnetization free layer 23c and the second magnetization free layer 24c near the medium opposing electrodes 29 and on end portions of the first magnetization free layer 23c and the second magnetization free layer 24c near the first and second electrodes 28a, 28b via insulating layers 32, 33. By magnetizing these magnetization controlling layers 34 and 35, magnetic fields which are orthogonal to magnetization M21 of the first magnetization pinning layer 23a and magnetization M22 of the second magnetization pinning layer 24a can be generated in the first magnetization free layer 23c and the second magnetization free layer 24c.

In this event, it is to be noted that intensity of the magnetic fields should be selected to such an extent as not to rotate both directions of magnetization M21 of the first magnetization pinning layer 23a and magnetization M22 of the second magnetization pinning layer 24a. This structure may also be employed in the first embodiment.

In this case, as shown in FIG. 7, magnetization M23 of the first magnetization free layer 23c and magnetization M24 of the second magnetization free layer 24c may be selected to take the same direction mutually.

If the external magnetic field $H_{sig}$ shown in FIG. 7 is applied to the first spin valve device 3 and the second spin valve device 4 in the direction from such spin valve MR head 21 toward the magnetic recording medium A, as shown by a broken line in FIG. 7, magnetization M23 of the first magnetization free layer 23c and magnetization M24 of the second magnetization free layer 24c are rotated and inclined to the magnetic recording medium A side.

Since components of magnetization M23 opposite to magnetization M21 of the first magnetization pinning layer 23a are thus increased in the first magnetization free layer 23c, electric resistance of the first spin valve device 23 is enhanced so that the voltage being input into the (+) side terminal of the differential amplifier circuit 7 is increased by $+\Delta V_1$.

On the contrary, since components of magnetization M24 in the same direction as magnetization M22 of the second magnetization pinning layer 24a are increased in the second magnetization free layer 24c, electric resistance of the second spin valve device 24 is reduced, which results in increase in the voltage being input into the (+) side terminal of the differential amplifier circuit 7 by $-\Delta V_2$.

By subtracting voltage applied across the second spin valve device 24 from voltage applied across the first spin valve device 23, voltage being input into the differential amplifier circuit 7 is varied by $\Delta V_1-(-\Delta V_2)$. Therefore, voltage change becomes high rather than voltage change in the MR head including only one spin valve device.

In the meanwhile, in case thermal asperity occurs, voltage applied across the first spin valve device 23 is increased to the same extent as voltage applied across the second spin valve device 24 since electric resistances are increased in both the first spin valve device 23 and the second spin valve device 24 in the same degree. Therefore, increase in respective resistances can be canceled in the differential amplifier circuit 7, whereby no resistance change due to thermal asperity can be read.

In FIG. 9, a reference 31 denotes a pair of substrates. The substrates 31 are formed so as to put the first spin valve device 23, the second spin valve device 24, and the electrodes therebetween, and have a magnetic insulating layer 10 and a magnetic shielding layer 11.

Third Embodiment

Figure 10A:
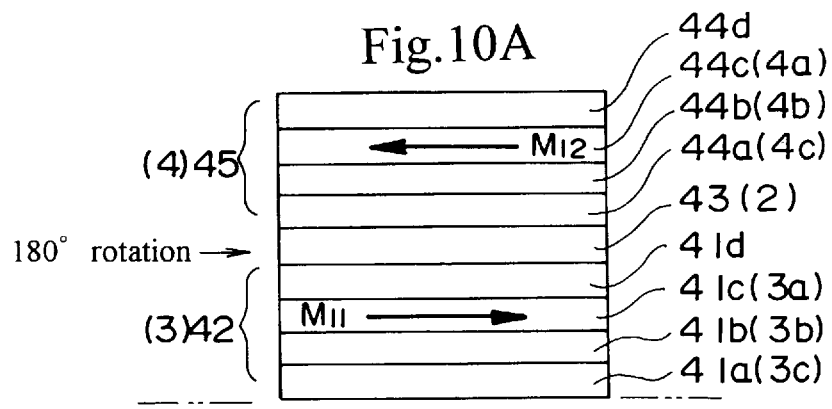
FIG. 10A is a side view showing a first example of layer structures of two spin valve devices, constituting the reproduction only magnetic head, according to the first or second embodiment of the present invention (third embodiment)
Figure 10B:
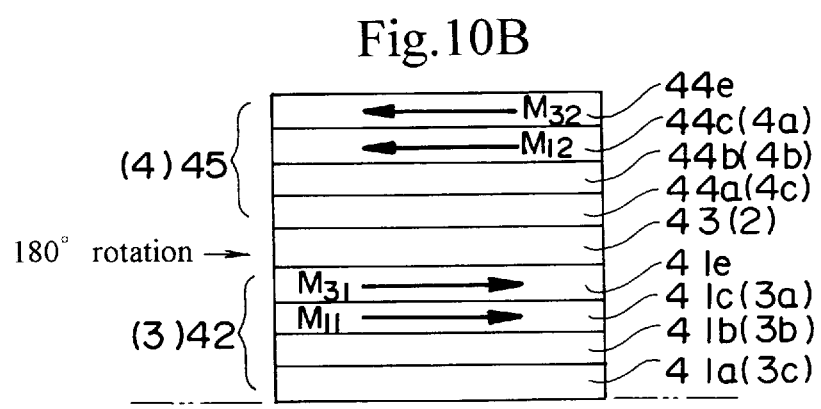
FIGS. 10B and 10C are side views showing variations of the first example of the layer structures of two spin valve devices respectively.
Figure 10C:
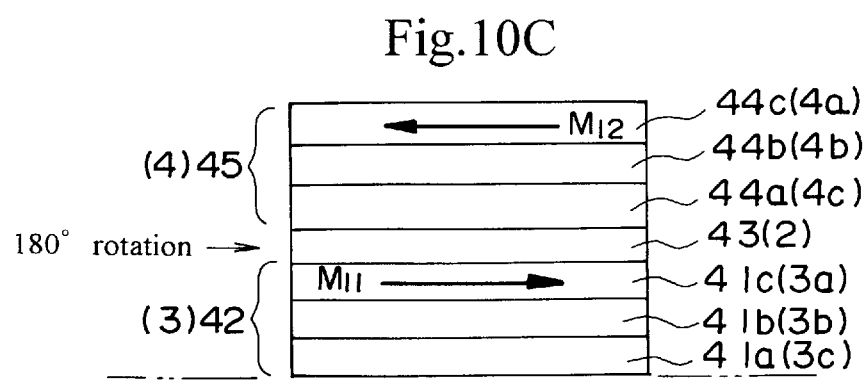

FIG. 10A is a side view showing a first example of layer structures of the first and second spin valve devices which have been explained in the first and second embodiments of the present invention. FIGS. 10B and 10C are side views showing variations of the first example of the layer structures in FIG. 10A respectively.

The first and second spin valve devices in the MR head according to the third embodiment are constituted by depositing a plurality of layers in sequence in the order of magnetization free layers, non-magnetic intermediate layers, and magnetization spinning layers from the substrate.

First a device structure shown in FIG. 10A will be explained.

A first magnetization free layer 41a made of soft magnetic material such as NiFe, a first non-magnetic intermediate layer 41b made of non-magnetic conductive material such as Cu, a first magnetization pinning layer 41c made of soft magnetic material such as NiFe, and a first antiferromagnetic layer 41d are formed on a substrate (not shown) in sequence. These layers may constitute a first spin valve device 42. Although FeMn, NiMn, NiO, etc. may be considered as material of the first antiferromagnetic layer 41d, the first antiferromagnetic layer 41d is not necessarily made of conductive material since no electrode is connected to the first antiferromagnetic layer 41d.

Then, a non-magnetic intermediate insulating layer 43 is formed of $Al_2O_3$, $SiO_2$, or the like. Subsequently, a second magnetization free layer 44a made of soft magnetic material such as NiFe, a second non-magnetic intermediate layer 44b made of non-magnetic conductive material such as Cu, a second magnetization pinning layer 44c made of soft magnetic material such as NiFe, and a second antiferromagnetic layer 44d are formed in order. Thus a second spin valve device 45 can be completed. Where conductive FeMn, NiMn, PdMn, or the like may be used as material of the second antiferromagnetic layer 44d since at least one of the current supplying electrodes and medium opposing electrode is connected to the second antiferromagnetic layer 44d.

After these films have been grown, they are patterned with the use of photolithography.

Meanwhile, magnetization M11 of the first magnetization pinning layer 41c and magnetization M12 of the second magnetization pinning layer 44c must be directed in anti-parallel by means of exchange coupling between the antiferromagnetic layers and the magnetization pinning layers. Therefore, following methods may be employed to set such magnetization direction.

As one of such methods, there is a method wherein the first antiferromagnetic layer 41d is formed of material having a high blocking temperature and the second antiferromagnetic layer 44d is formed of material having a low blocking temperature.

Figure 11A:
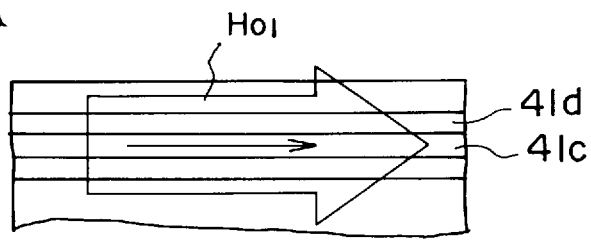
FIGS. 11A to 11D are side views showing a first magnetization method and patterning steps for two spin valve devices, constituting the reproduction only magnetic head, according to the first or second embodiment of the present invention.
Figure 11B:
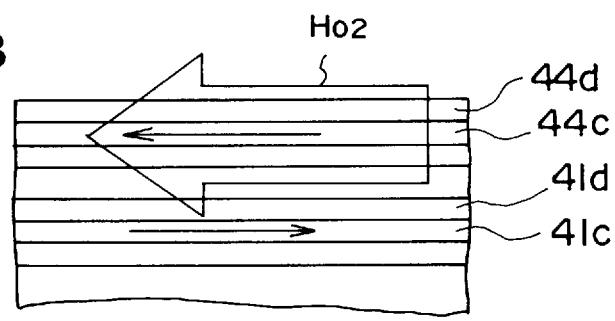

For purposes of example, as shown in FIG. 11A, NiMn having a high blocking temperature is formed as the first antiferromagnetic layer 41d on the first magnetization pinning layer 41c at a temperature of 200° to 300° C. The NiMn is grown in a magnetic field $H_{O1}$ applied in the first direction. Thereafter, as shown in FIG. 11B, FeMn is formed as the second antiferromagnetic layer 44d on the second magnetization spinning layer 44c at a temperature of around 160° C. While applying a magnetic field $H_{O2}$ in the direction opposite to the first direction, the growth of FeMn is carried out.

Mutual exchange operation takes place in the $N_iN_n$ at a temperature of 200° to 300° C., but the blocking temperature of FeMn is at about 160° C. Therefore, magnetization direction of the first antiferromagnetic layer 41d is not changed because of the magnetic field $H_{O2}$ used upon forming the second antiferromagnetic layer 44d.

Figure 11C:
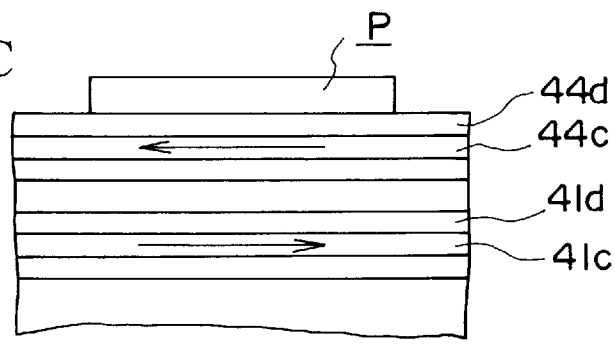
Figure 11D:
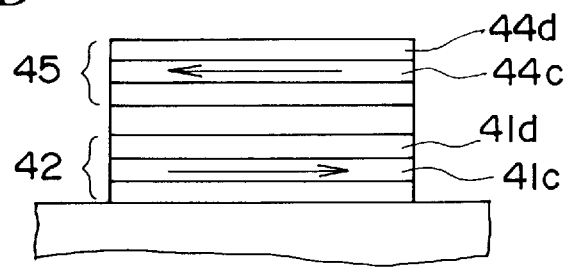

Thereafter, as shown in FIG. 11C, a resist mask P is formed on the second antiferromagnetic layer 44d. Next, as shown in FIG. 11D, first and second spin valve devices 42, 45 are shaped as a predetermined shape by removing portions not covered with the resist mask P by means of ion milling. The resist mask P is removed after patterning.

It should be understood that first the magnetic field $H_{O1}$ in the first direction may be applied after the first antiferromagnetic layer 41d is formed, and then the magnetic field $H_{O2}$ may be applied after the second antiferromagnetic layer 44d is formed.

In this case, directions of exchange coupling have been determined in the middle of forming the first antiferromagnetic layer 41d and the second antiferromagnetic layer 44d, but such directions may be determined after formation of the first antiferromagnetic layer 41d and the second antiferromagnetic layer 44d is completed.

Figure 12A:
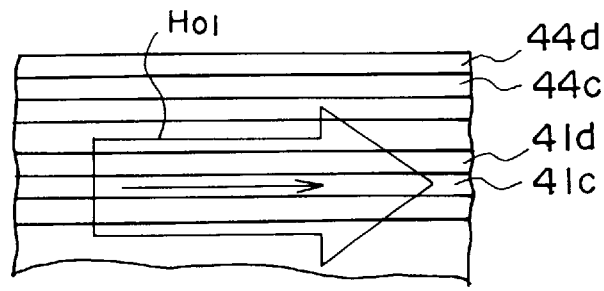
FIGS. 12A to 12D are side views showing a second magnetization method and patterning steps for two spin valve devices, constituting the reproduction only magnetic head, according to the first or second embodiment of the present invention.
Figure 12B:
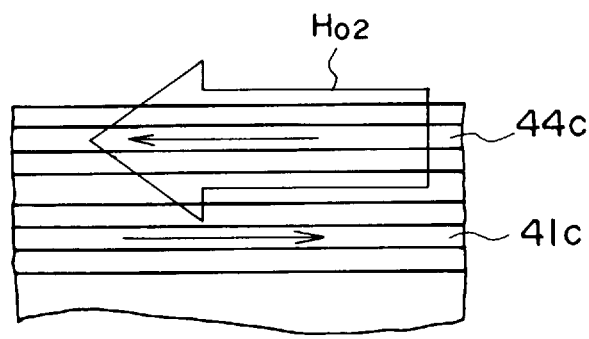
Figure 12C:
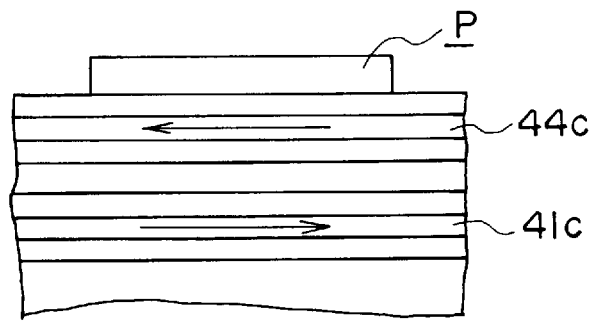
Figure 12D:
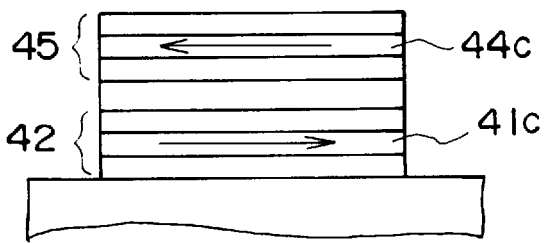

For instance, at first the first spin valve device 42 including the first antiferromagnetic layer 41d formed of NiMn is formed and then the second spin valve device 45 including the second antiferromagnetic layer 44d formed of FeMn is formed. Next, as shown in FIG. 12A, the first antiferromagnetic layer 41d is heated in the magnetic field $H_{O1}$ in the first direction at a temperature to cause exchange coupling. Then, as shown in FIG. 12B, the second antiferromagnetic layer 44d is heated up to around a blocking temperature and then the magnetic field $H_{O2}$ is applied in the direction opposite to the first direction. As a result, magnetization direction of exchange coupling by the first antiferromagnetic layer 41d is in anti-parallel to magnetization direction of exchange coupling by the second antiferromagnetic layer 44d. Subsequently, as shown in FIGS. 12C and 12D, the first spin valve device 42 and the second spin valve device 45 are patterned into a desired shape with the use of the resist mask P.

Next, explanation will be made of a device structure shown in FIG. 10B.

A layer structure shown in FIG. 10B is different from the layer structure shown in FIG. 10A in that a first hard magnetic layer 41e is employed in place of the first antiferromagnetic layer 41d and that a second hard magnetic layer 44e is employed in place of the second antiferro-magnetic layer 44d. CoCrPt, CoCrTa, etc. may be used as hard magnetic material. The second hard magnetic layer 44e must be formed of conductive material because terminals are connected thereto.

Magnetization M31 of the first hard magnetic layer 41e and magnetization M32 of the second hard magnetic layer 44e are formed to be anti-parallel to each other. The following may be advised as magnetization process.

For example, to enhance coercive force Hc1 of the first hard magnetic layer 41e rather than coercive force Hc2 of the second hard magnetic layer 44e, CoCrTa, CoCrPt, etc. is used as the second hard magnetic layer 44e and CoNiCr, etc. is used as the first hard magnetic layer 41e. The first hard magnetic layer 41e is grown in the first magnetic field $H_{O1}$ and then the second hard magnetic layer 44e is grown in the second magnetic field $H_{O2}$ which has an amplitude not to alter the direction of magnetization M31 of the first hard magnetic layer 41e. The first magnetic field $H_{O1}$ and the second magnetic field $H_{O2}$ are directed oppositely.

According to the layer structure shown in FIG. 10B, directions of magnetization M11 of the first magnetization pinning layer 41c and magnetization M12 of the second magnetization pinning layer 44c have been determined based on magnetization M31 of the first hard magnetic layer 41e and magnetization M32 of the second hard magnetic layer 44e respectively. However, as shown in FIG. 10C, the first magnetization pinning layer 41c and the second magnetization pinning layer 44c may be formed of hard magnetic material respectively. Respective layers may be sputter-deposited in vacuum atmosphere, for example. This is true similarly in the following embodiments.

Fourth Embodiment

In the above third embodiment, the case has been explained wherein respective layers constituting the first and second spin valve devices of the MR head have been formed in the order of magnetization free layer, non-magnetic intermediate layer, and magnetization pinning layer. However, the order of forming respective layers is not necessarily limited to this order. Different layer structures from the third embodiment will be explained hereinbelow.

In a fourth embodiment, layers constituting the first spin valve device are grown on the substrate in the order of magnetization pinning layer, magnetization free layer, and non-magnetic intermediate layer, and the second spin valve device is formed in a similar manner as the third embodiment.

Figure 13A:
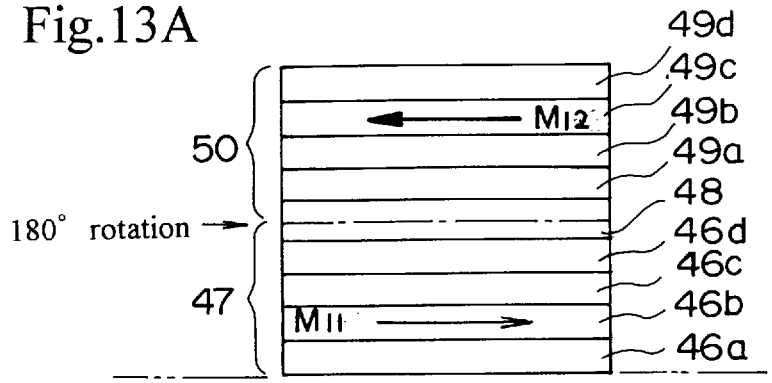
FIG. 13A is a side view showing a second example of layer structures of two spin valve devices, constituting the reproduction only magnetic head, according to the first or second embodiment of the present invention (fourth embodiment)

FIG. 13A shows an example of such layer structures of two spin valve devices.

A first antiferromagnetic layer 46a made of conductive magnetic material such as NiMn, PdMn, etc., a first magnetization pinning layer 46b made of soft magnetic material such as NiFe, a first non-magnetic intermediate layer 46c made of non-magnetic conductive material such as Cu, and a first magnetization free layer 46d made of soft magnetic material such as NiFe are formed on a substrate (not shown) in sequence. A first spin valve device 47 is made up of these layers. The first antiferromagnetic layer 46a is made of conductive material because the under-layer of the layer 46a serves as a terminal connecting surface. However, unless the under-layer of the layer 46d is made of NiFe, fcc crystal structures are not formed in FeMn and therefore FeMn cannot be employed as material of the first antiferromagnetic layer 46a.

After a non-magnetic intermediate insulating layer 48 is formed, a second magnetization free layer 49a made of soft magnetic material such as NiFe, a second non-magnetic intermediate layer 49b made of non-magnetic conductive material such as Cu, and a second magnetization spinning layer 49c made of soft magnetic material such as NiFe are formed sequentially. A second antiferromagnetic layer 49d is then formed on the second magnetization spinning layer 49c, whereby a second spin valve device 50 can be finished. Since either current supplying electrode or medium opposing electrode is connected to the second antiferro-magnetic layer 49d, FeMn, NiMn, PdMn, or the like with conductivity may be used as the second antiferromagnetic layer 49d.

After finishing layer growth, patterning of these layers constituting the first spin valve device 47 and the second spin valve device 50 are carried out with the use of photolithography.

In the middle of forming the above layers or after the above layers are formed, direction of magnetization M11 of the first magnetization pinning layer 46b fixed by the first antiferromagnetic layer 46a and direction of magnetization M12 of the second magnetization spinning layer 49c fixed by the second antiferromagnetic layer 49d are directed in anti-parallel. As is the case in the third embodiment, difference in the blocking temperature may be employed as magnetization process.

Next, explanation will be made of a layer structure shown in FIG. 13B.

Figure 13B:
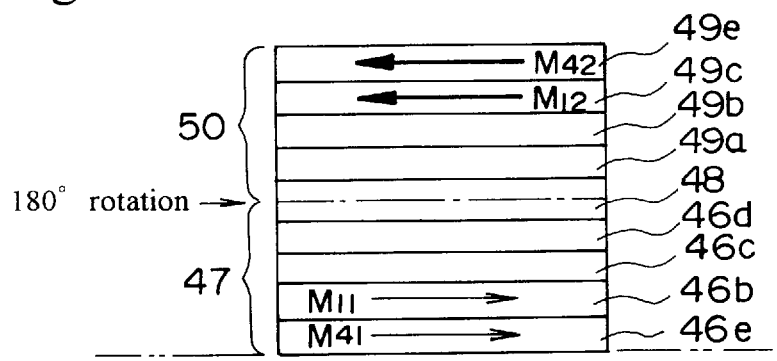
FIGS. 13B and 13C are side views showing variations of the second example of the layer structures of two spin valve devices respectively.

Differences between a layer structure shown in FIG. 13B and the layer structure shown in FIG. 13A reside in that first and second hard magnetic layers 46e, 49e are employed instead of the first and second antiferromagnetic layers 46a, 49d. The first and second hard magnetic layers 46e, 49e to which terminals are connected have to be formed of conductive hard magnetic material such as CoCrPt, CoCrTa, etc.

The first hard magnetic layer 46e and the second hard magnetic layer 49e are magnetized to be anti-parallel to each other. As has been explained in the third embodiment, difference in coercive force of magnetic materials is used as magnetization process.

Figure 13C:
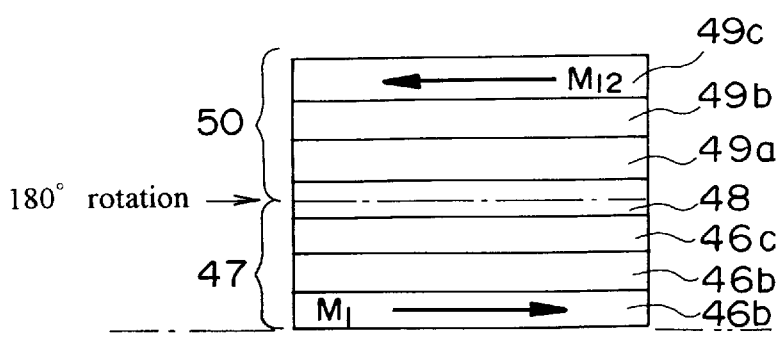

According to the layer structure shown in FIG. 13B, directions of magnetization M11 of the first magnetization pinning layer 46b and magnetization M12 of the second magnetization pinning layer 49c have been determined in compliance with magnetization M41 of the first hard magnetic layer 46e and magnetization M42 of the second hard magnetic layer 49e respectively. However, as shown in FIG. 13C, the first magnetization pinning layer 46b and the second magnetization pinning layer 46c may be formed of hard magnetic material respectively.

Fifth Embodiment

In a fifth embodiment, the case will be discussed wherein layers constituting a second spin valve device of two spin valve devices, i.e., an upper spin valve device located relative to a substrate are formed differently from those in the third and fourth embodiments.

First a device structure shown in FIG. 14A will be explained hereinbelow.

A first magnetization free layer 51a made of soft magnetic material such as NiFe, a first non-magnetic intermediate layer 51b made of non-magnetic conductive material such as Cu, a first magnetization pinning layer 51c made of soft magnetic material such as NiFe, and a first antiferromagnetic layer 51d are formed sequentially on a substrate (not shown), whereby a first spin valve device 52 can be formed. FeMn, NiMn, NiO, etc. may be listed as material of the first antiferromagnetic layer 51d, and thus conductive material is not always used as the first antiferromagnetic layer 51d.

After this, a non-magnetic intermediate insulating layer 53 is formed. Then, a second antiferromagnetic layer 54b such as NiMn, PdMn, NiO, etc., a second magnetization spinning layer 54b made of soft magnetic material such as NiFe, a second non-magnetic intermediate layer 54c made of non-magnetic conductive material such as Cu, and a second magnetization free layer 54d made of soft magnetic material such as NiFe are formed in order. Thereby a second spin valve device 55 can be accomplished. Where there is no need of conductive material for the second antiferromagnetic layer 54a since no electrode is connected to the second antiferromagnetic layer 54a, but FeMn without fcc crystal structure cannot be used since the under-layer of the layer 54a is formed as the intermediate insulating layer.

After growth of these layers has been finished, these layers are patterned with the use of photolithography.

Magnetization M11 of the first magnetization pinning layer 51c fixed by the first antiferromagnetic layer 51d and magnetization M12 of the second magnetization spinning layer 54b fixed by the second antiferromagnetic layer 54a must be directed in anti-parallel to each other. Like the third embodiment, difference in the blocking temperature may be employed as magnetization process.

Next, explanation will be made of a structure shown in FIG. 14B.

Figure 14A:
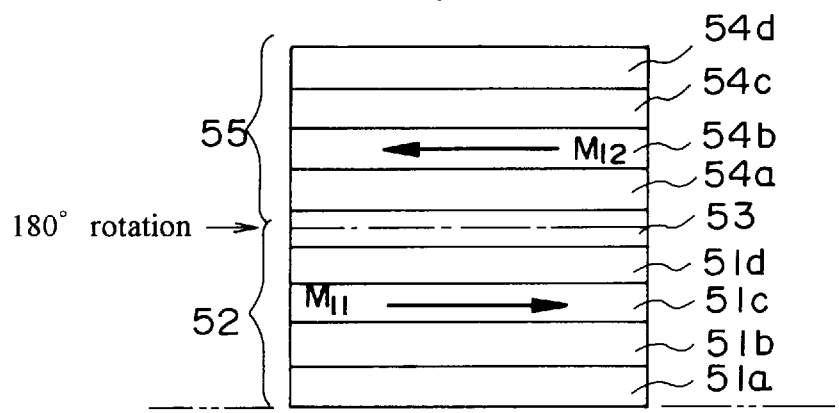
FIG. 14A is a side view showing a third example of layer structures of two spin valve devices, constituting the reproduction only magnetic head, according to the first or second embodiment of the present invention (fifth embodiment)
Figure 14B:
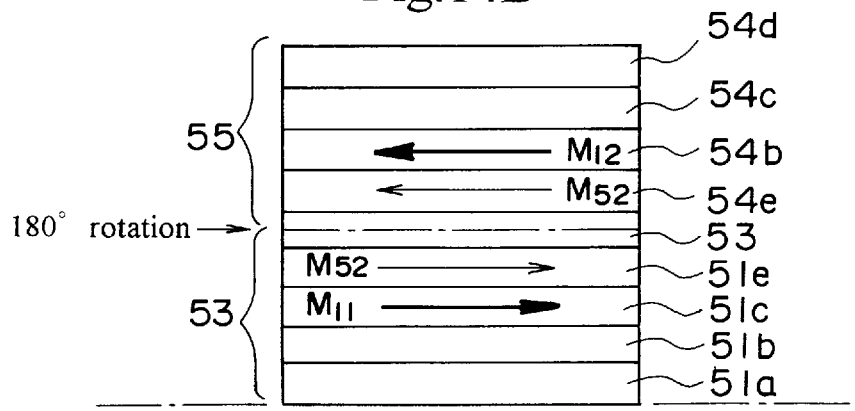
FIG. 14B is a side view showing a variation of the third example of the layer structures of two spin valve devices.

A layer structure shown in FIG. 14B is distinguish-able from the layer structure shown in FIG. 14A by a respect that first and second hard magnetic layers 51e, 54e are employed instead of the first and second antiferromagnetic layers 51d, 54a. Although CoCrPt, CoCrTa, etc. may be used as hard magnetic material, there is no necessity that the first and second hard magnetic layers 51e, 54e are formed of conductive material since the first and second hard magnetic layers 51e, 54e are not connected to the electrodes.

The first hard magnetic layer 5le and the second hard magnetic layer 54e are magnetized to be anti-parallel to each other. As has been explained in the third embodiment, difference in coercive force of magnetic materials is used as magnetization process.

Figure 15A:
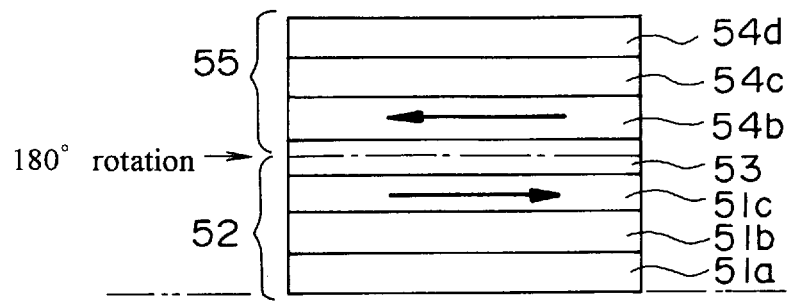
FIGS. 15A and 15B are side views showing another variation of the third example of the layer structures of two spin valve devices, constituting the reproduction only magnetic head, according to the first or second embodiment of the present invention respectively.

According to the layer structure shown in FIG. 14B, magnetization directions of the first magnetization pinning layer 51c and the second magnetization pinning layer 54b have been determined in compliance with magnetization M51 of the first hard magnetic layer 51e and magnetization M52 of the second hard magnetic layer 54e respectively. However, as shown in FIG. 15A, the first magnetization pinning layer 51c and the second magnetization pinning layer 54b may be formed of hard magnetic material respectively so that the first and second hard magnetic layers may be omitted.

Figure 15B:
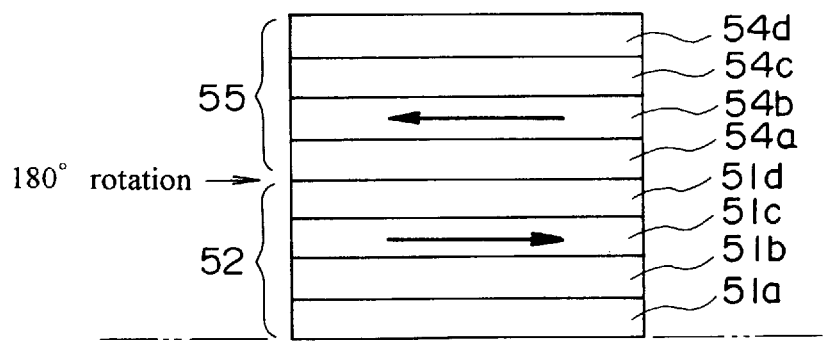

In FIG. 14A, insulating material such as NiO, CoO, etc. may be used as the first and second antiferromagnetic layers 51d and 54a. In this event, as shown in FIG. 15B, the non-magnetic intermediate insulating layer 53 to isolate electrically the first spin valve device 52 with the second spin valve device 55 is negligible.

Sixth Embodiment

In a sixth embodiment, the case will be explained hereinbelow wherein antiferromagnetic layers or hard magnetic layers are arranged on the substrate side to control magnetization direction of respective magnetization spinning layers of the first and second spin valve devices.

Figure 16A:
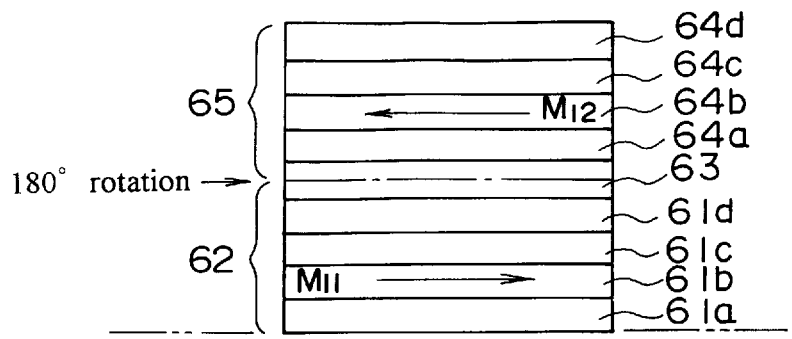
FIG. 16A is a side view showing a fourth example of layer structures of two spin valve devices, constituting the reproduction only magnetic head, according to the first or second embodiment of the present invention (sixth embodiment)

FIG. 16A shows an example of layer structures of the first and second spin valve devices.

A first antiferromagnetic layer 61a made of conductive magnetic material such as NiMn, PdMn, etc., a first magnetization pinning layer 61b made of soft magnetic material such as NiFe, a first non-magnetic intermediate layer 61c made of non-magnetic conductive material such as Cu, and a first magnetization free layer 61d made of soft magnetic material such as NiFe are formed on a substrate (not shown) in sequence. These layers may constitute a layer structure of a first spin valve device 62. Conductive material has been used as the first antiferro-magnetic layer 61a because the under-layer is used as a terminal connecting surface, but the first antiferromagnetic layer 61a cannot be formed of FeMn having the fcc crystal structure because the under-layer is not formed of NiFe.

After the non-magnetic intermediate insulating layer 63 has been formed, a second antiferromagnetic layer 64d such as NiMn, PdMn, NiO, etc., a second magnetization spinning layer 64b made of soft magnetic material such as NiFe, a second non-magnetic intermediate layer 64c made of non-magnetic conductive material such as Cu, and a second magnetization free layer 64d made of soft magnetic material such as NiFe are formed in order, whereby a layer structure of a second spin valve device 65 can be completed. Where there is no necessity that the second antiferromagnetic layer 64a is formed of conductive material since no electrode is connected to the second antiferromagnetic layer 64a, but FeMn which does not take the fcc crystal structure cannot be used since the under-layer of the layer 64a is formed as the intermediate insulating layer 63.

After growth of these layers has been terminated, these layers are patterned with the use of photolithography.

In the meanwhile, magnetization M11 of the first magnetization pinning layer 61b fixed by the first antiferromagnetic layer 61a and magnetization M12 of the second magnetization spinning layer 64b fixed by the second antiferromagnetic layer 64a are be directed in anti-parallel to each other. A method employing difference in the blocking temperature of magnetic materials may be used as magnetization process, as shown in the third embodiment.

Next, explanation will be made of a layer structure shown in FIG. 16B and 16C hereinbelow.

A layer structure shown in FIG. 14B is different from the layer structure shown in FIG. 14A in that first and second hard magnetic layers 61e, 64e are used in place of the first and second antiferromagnetic layers 61a, 64a. Though CoCrPt, CoCrTa, etc. may be used as hard magnetic material, there is no need that the second hard magnetic layer 64e is formed of conductive material since it is not connected to the electrodes.

The first hard magnetic layer 61e and the second hard magnetic layer 64e are magnetized mutually in the anti-parallel direction. As has also been explained in the third embodiment, difference in coercive force of magnetic materials is used as magnetization process.

Figure 16B:
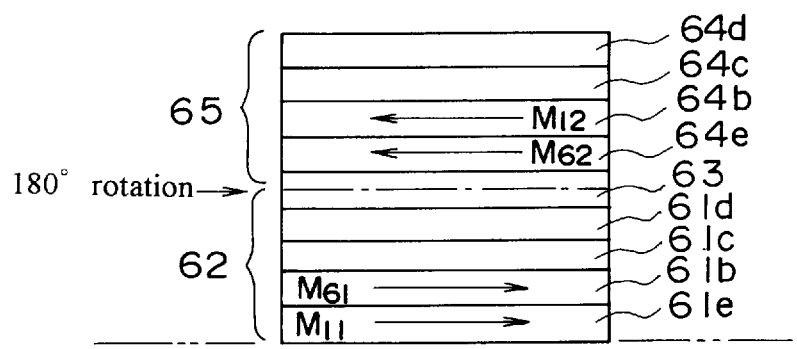
FIGS. 16B and 16C are side views showing variations of the fourth example of the layer structures of two spin valve devices respectively.
Figure 16C:
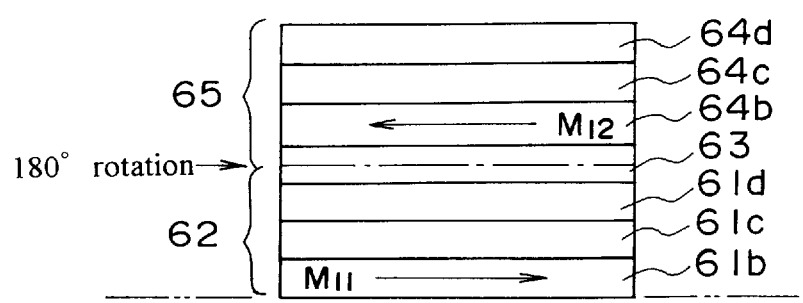

According to the layer structure shown in FIG. 16B, magnetization M11 and M12 of the first magnetization pinning layer 61b and the second magnetization pinning layer 64b have been directed in compliance with magnetization M61 of the first hard magnetic layer 61e and magnetization M62 of the second hard magnetic layer 64e respectively. However, as shown in FIG. 16C, the first magnetization pinning layer 61a and the second magnetization pinning layer 64b may be formed of hard magnetic material respectively.

Seventh Embodiment

Figure 17:
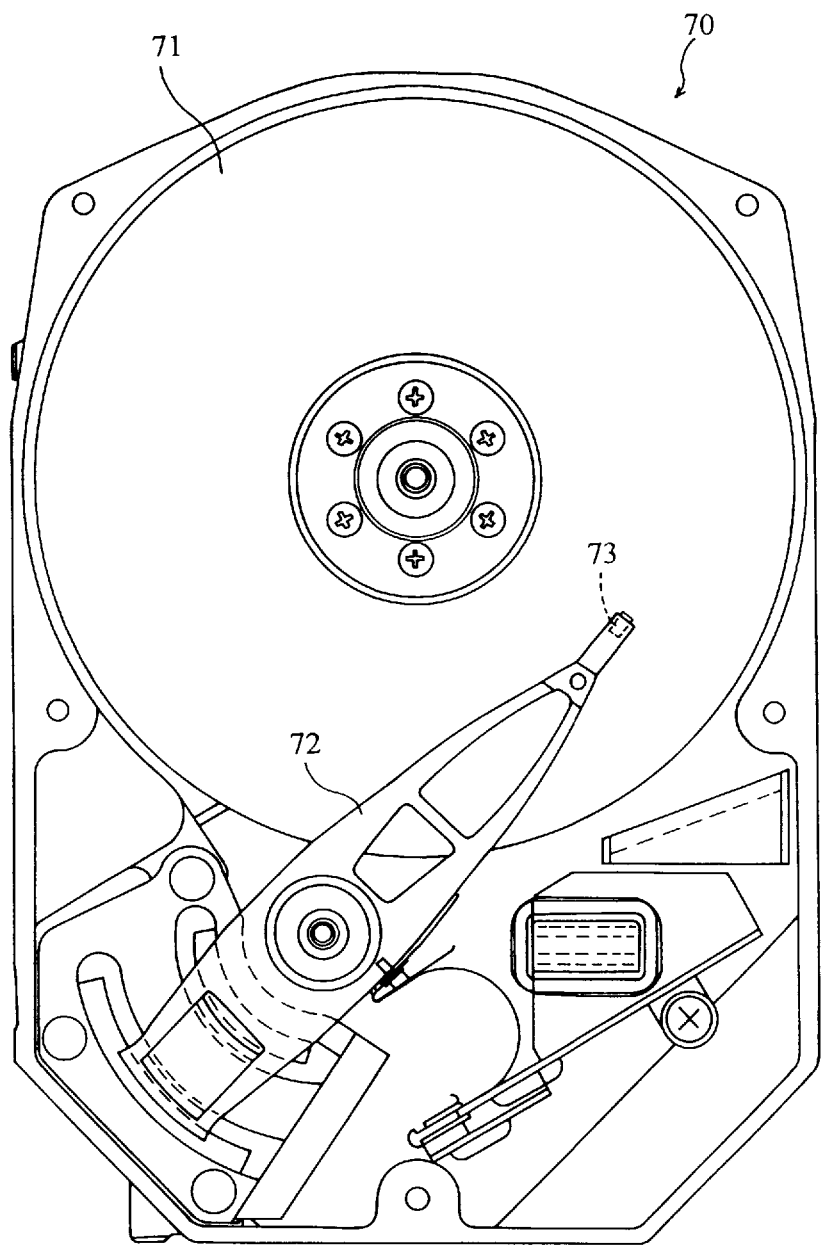
FIG. 17 is a plan view showing an internal structure of a magnetic disk drive to which the reproduction only magnetic head according to the present invention (seventh embodiment)

As shown in FIG. 17, the spin valve MR head having the above structure can be used in a magnetic disk drive.

In FIG. 17, the magnetic disk drive 71 as the magnetic recording medium and a suspension 72 are fitted to a housing 70. One end of the suspension 72 is arranged movably over the magnetic disk drive 71, and a slider 73 which flies over the magnetic disk drive 71 is fitted to one end of the suspension 72. The spin valve MR head 1 (21) which has already been explained is attached to the slider 73.

Figure 18:
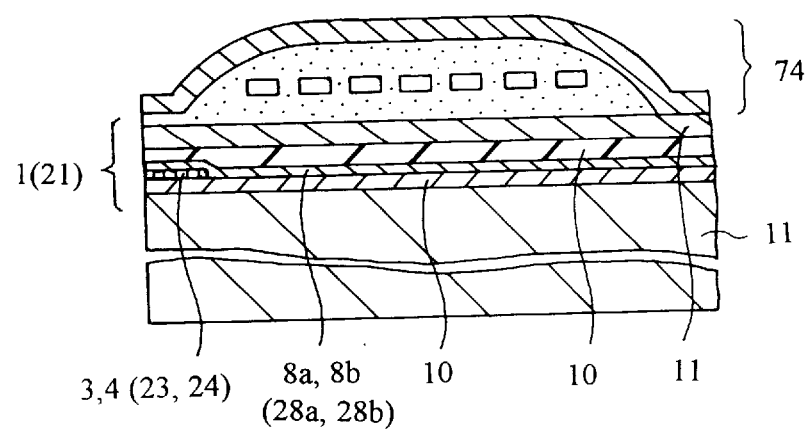
FIG. 18 is a sectional view showing a recording/reproducing magnetic head according to the present invention.

As shown in FIG. 18, the inductive type recording only magnetic head 74 is formed on the spin valve MR head 1 (21).

Various modifications will be possible for those skilled in the art without departing from the scope thereof.

What is claimed is:

1. A spin valve magnetoresistive head comprising:
    a first spin valve device having a first magnetic free layer and a first magnetization pinning layer magnetized in a first direction, said first layers being separated by a first non-magnetic intermediate layer;
    a second spin valve device formed on said first spin valve device, said first and second spin valve devices being separated by an insulating layer, said second spin valve device having a second magnetization free layer and a second magnetization pinning layer magnetized in a second direction, said second layers being separated by a second non-magnetic intermediate layer, said second direction being in anti-parallel to said first direction; and
    a pair of first electrodes including a one first electrode and another first electrode, each said first electrode being connected near opposite sides of said first spin valve device, said opposite sides of said first spin valve device being separated in a longitudinal direction of said first spin valve device; and
    a pair of second electrodes including a one second electrode and another second electrode, each said second electrode being connected near opposite sides of said second spin valve device, said opposite sides of said second spin valve device being separated in a longitudinal direction of said second spin valve device, said one first electrode being connected to said one second electrode, and said another first electrode being insulated from said another second electrode.

2. A spin valve magnetoresistive head as claimed in claim 1, further including a medium opposing surface, and wherein said first direction and said second direction are orthogonal to said medium opposing surface respectively.

3. A spin valve magnetoresistive head as claimed in claim 2, wherein current sources are connected respectively to said another first electrode and said another second electrode to flow a sense current in a parallel or perpendicular direction to said medium opposing surface.

4. A spin valve magnetoresistive head as claimed in claim 1, wherein said first spin valve device and said second spin valve device each have medium opposing surfaces generally parallel to said medium and separated from said medium by a distance, said one first electrode and said one second electrode are connected to corresponding said medium opposing surfaces of said first spin valve device and said second spin valve device respectively, said one first electrode and said one second electrode generally extending in a perpendicular or parallel direction from said medium opposing surfaces.

5. A spin valve magnetoresistive head as claimed in claim 4, wherein current sources are connected to said another first electrode and said another second electrode to flow a sense current in a parallel or perpendicular direction to said medium opposing surfaces.

6. A spin valve magnetoresistive head as claimed in claim 4, wherein one of said first or second electrodes is formed of either a conductive film which covers both said medium opposing surfaces of said first spin valve device and said second spin valve device or a conductive layer which is formed as a surface layer on each said medium opposing surface.

7. A spin valve magnetoresistive head as claimed in claim 4, wherein electric potential which is identical to that of said magnetic recording medium is applied to electrodes of said one first electrode and said one second electrode.

8. A spin valve magnetoresistive head as claimed in claim 7, wherein said one first electrode and said one second electrode are connected to a magnetic shielding enclosing said first spin valve device and said second spin valve device.

9. A spin valve magnetoresistive head as claimed in claim 1, wherein respective magnetization directions of said first magnetization free layer and said second magnetization free layer are set in parallel to a medium opposing surface to a magnetic recording medium and in parallel or anti-parallel to each other.

10. A spin valve magnetoresistive head as claimed in claim 1, wherein said first magnetization pinning layer of said first spin valve device is formed to contact with a first antiferromagnetic layer, and magnetization of said first magnetization pinning layer in said first direction is fixed by said first antiferromagnetic layer,
    said second magnetization pinning layer of said second spin valve device is formed to contact with a second antiferromagnetic layer, and magnetization of said second magnetization pinning layer in said second direction is fixed by said second antiferromagnetic layer, and
    said first antiferromagnetic layer and said second antiferromagnetic layer are magnetically isolated by said insulating layer.

11. A spin valve magnetoresistive head as claimed in claim 1, wherein said first magnetization pinning layer of said first spin valve device is formed to contact with a first hard magnetic layer, and magnetization of said first magnetization pinning layer in said first direction is fixed by said first hard magnetic layer, and
    said second magnetization pinning layer of said second spin valve device is formed to contact with a second hard magnetic layer, and magnetization of said second magnetization pinning layer in said second direction is fixed by said second hard magnetic layer.

12. A spin valve magnetoresistive head as claimed in claim 1, wherein said first magnetization pinning layer of said first spin valve device is formed of a first hard magnetic material, and
    said second magnetization pinning layer of said second spin valve device is formed of a second hard magnetic material.

* * * * *

UNITED STATES PATENT AND TRADEMARK OFFICE
CERTIFICATE OF CORRECTION

PATENT NO. : 5,859,753
DATED : January 12, 1999
INVENTOR(S) : Ohtuska et al.

It is certified that error appears in the above-identified patent and that said Letters Patent is hereby corrected as shown below:

On the Title Page

Under "[54] Title", delete "SPUN" and insert --SPIN-- therefor

Under "[56] References Cited for Foreign

Patent Documents", insert:

| | | |
|---|---|---|
| --07045884 | 2/14/95 | Japan |
| WO/19627 | 7/20/95 | PCT |
| 07202292 | 8/4/95 | Japan |
| 0 676 746 | 10/11/95 | EPO-- |

UNITED STATES PATENT AND TRADEMARK OFFICE
CERTIFICATE OF CORRECTION

PATENT NO. : 5,859,753
DATED : January 12, 1999
INVENTOR(S) : Ohtuska et al.

It is certified that error appears in the above-identified patent and that said Letters Patent is hereby corrected as shown below:

Under "[56] References Cited for Other Publications", insert:

-- "A New, Horizontal MR Head Structure", D.W. Chapman, D.E. Heim, and M.I. Williams, Magnetic-Recording Institute, IBM Corp., IEEE Transactions on Magnetics, No. 5, pp. 3689-3691, Sept., 1989;

"New Spin-Valve Magnetic Field Sensors Combined with Strain Sensing and Strain Compensation, R.C. O'Handley, and J.R. Childress, IEEE Transactions on Magnetic, No. 4, pp. 2450-2454, July, 1995.--

Column 1, line 28, delete ", such"

UNITED STATES PATENT AND TRADEMARK OFFICE
CERTIFICATE OF CORRECTION

PATENT NO. : 5,859,753
DATED : January 12, 1999
INVENTOR(S) : Ohtuska et al.

It is certified that error appears in the above-identified patent and that said Letters Patent is hereby corrected as shown below:

Column 5, line 6, delete "blowing" and insert --flowing-- therefor

Column 9, line 58, delete " Where conductive" and insert --Conductive-- therefor Signed and Sealed this Fifteenth Day of February, 2000

Attest:

Q. TODD DICKINSON

Attesting Officer

Commissioner of Patents and Trademarks